United States Patent [19]

Yamazaki

[11] Patent Number: 5,212,150
[45] Date of Patent: May 18, 1993

[54] OXIDE SUPERCONDUCTING LEAD FOR INTERCONNECTING DEVICE COMPONENT WITH A SEMICONDUCTOR SUBSTRATE VIA AT LEAST ONE BUFFER LAYER

[75] Inventor: Shunpei Yamazaki, Tokyo, Japan

[73] Assignee: Semiconductor Energy Laboratory Co., Ltd., Kanagawa, Japan

[21] Appl. No.: 483,769

[22] Filed: Feb. 16, 1990

Related U.S. Application Data

[60] Division of Ser. No. 188,413, Apr. 29, 1988, which is a continuation-in-part of Ser. No. 165,955, Mar. 9, 1988, abandoned.

[30] Foreign Application Priority Data

May 6, 1987 [JP] Japan .................... 62-111613

[51] Int. Cl.$^5$ .............. H01B 12/00; H01L 23/48; H01L 39/00
[52] U.S. Cl. .................. 505/1; 257/663; 257/757; 257/769; 257/770; 505/703; 505/706; 505/780
[58] Field of Search ............ 357/71, 4, 5, 67

[56] References Cited

U.S. PATENT DOCUMENTS 4,837,609 6/1989 Gurvitch et al. .............. 357/71

OTHER PUBLICATIONS

Koch et al. "Thin films and SQUIDS made from $YBa_2Cu_3Oy$" presented at Physical Society Meeting (video tape) Mar. 15, 1987, pp. 81-84 vol. 26 No. 4 Jap. J. Applied Phys. pp. L521-L523.

Moriwaki et al. "Josephson Junctions in La Sr CuO S/C Poly Crystalline films" (Apr. 1987).

Aida et al. "Preparation of $YBa_2Cu_3O_{7-x}$ Superconducting Thin Films by RF-Magnetron Sputtering" *Jap. J. Appl. Phys.*, vol. 26 No. 9 (Sep. 1987) pp. L1489-L1491.

Sleight et al. "Superconductivity and the Metal-Semiconductor Transition" (1987) *Advanced Ceramic Materials* vol. 2, No. 3B Special Issue (ACerS) pp. 713-718.

Gavaler et al. "Near Surface Atomic Segregation in YBCO Thin Films" (Apr. 14, 1988), *Proc. HTSC-M$^2$*, Interlaken 1988 (Physica C paper No. C262).

*Primary Examiner*—Rolf Hille
*Assistant Examiner*—Mahshid Saadat
*Attorney, Agent, or Firm*—Sixbey, Friedman, Leedom & Ferguson

[57] ABSTRACT

A superconducting device comprises a substrate having an electric connecting section and a copper oxide superconducting material thereon, and an electric interconnecting means for the electric connecting section and the superconducting material formed from a first member selected from the group of copper, gold, platinum and materials including copper, gold, and platinum as a main component and tightly attached to the superconducting material, and/or a second member selected from the group of a heat resistant metal material and its compound with the first member and the substrate material and tightly attached to the first member and the substrate.

18 Claims, 3 Drawing Sheets

OXIDE SUPERCONDUCTING LEAD FOR INTERCONNECTING DEVICE COMPONENT WITH A SEMICONDUCTOR SUBSTRATE VIA AT LEAST ONE BUFFER LAYER

This is a divisional application of Ser. No. 07/188,413 filed Apr. 29, 1988, which in turn is a continuation-in-part of Ser. No. 07/165,955 filed Mar. 9, 1988, now abandoned.

FIELD OF THE INVENTION

The present invention relates to a superconducting device using an oxide superconducting material, and particularly to a superconducting device having a semiconductor device the interconnecting wiring of which is formed from a superconducting material with reliability increased at connections between the superconducting material and the substrate and the semiconductor device, and more particularly to a superconducting device wherein the superconducting device exhibits superconductivity at a temperature between 70° and 100° K., and preferably at or above a temperature of 77° K.

BACKGROUND OF THE INVENTION

Conventionally, a wire rod of a Nb-Ge metallic material (for example, $Nb_3Ge$) and the like is used as a superconducting material. However, it is limited to such uses as for a superconducting magnet.

In addition, in recent years ceramic materials which exhibit superconducting properties are known. However, these are also in tablet form and as yet there has been no development of superconducting materials in thin film form.

Methods by which thin film is produced by patterning, using photolithographic techniques, and the use of this thin film as one part of the connecting wiring of a semiconductor device are also completely unknown.

There has also been no consideration on reliability at connections or contacts between the semiconductor device and the oxide superconducting material.

The development of more and more refined semiconductor integrated circuits with high speed action has in recent years become a necessity. Also, along with this refinement a drop in reliability from the heat generated in the semiconductor element and also a reduction in activation speed in the heated parts has become a problem.

When the foregoing semiconductor elements are cooled to the temperature of liquid nitrogen, the mobility of the electrons or the holes can be increased 3 or 4 times. In addition, it becomes possible to increase the frequency of operation of the device.

In order to eliminate such problems, the inventor of the present invention previously invented a superconducting semiconductor device as described in the copending Patent Applications NO. SHO-62-053724 and SHO-63-053725, which were entitled "Superconducting Semiconductor Device" and filed on Mar. 9, 1987. In such a superconducting semiconductor device, the lead wire is made of an oxide superconducting material. In a material of this type, after the material is formed on the surface to be formed, oxidation must be carried out over a long period in an oxidizing atmosphere. For this reason, the oxidizing reaction occurs simultaneously at the contact section with the semiconductor device provided on its bottom side. It should be noted that the oxide material of that semiconductor material is silicon oxide which is an insulating material.

On the other hand, the superconducting material is a copper compound. If this copper becomes diffused throughout the semiconductor through the contact section, recombination center would be created because copper is an interstitial type atom.

Accordingly, improvement in the heat resistant and oxidation resistant capabilities of this contact section is considered to be extremely important.

SUMMARY OF THE INVENTION

An object of the present invention is to provide, with due consideration to the drawbacks of such conventional devices, a semiconductor device having an interconnecting wiring provided by means of a ceramic material which exhibits superconductivity at low temperatures (70° K. to 100° K., and preferably 77° K. or higher), wherein the interconnecting wiring is tightly connected at a contact section with the semiconductor device provided on its bottom side and made from a heat-resistant metal or its compound with a semiconductor material.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Figure 1A:
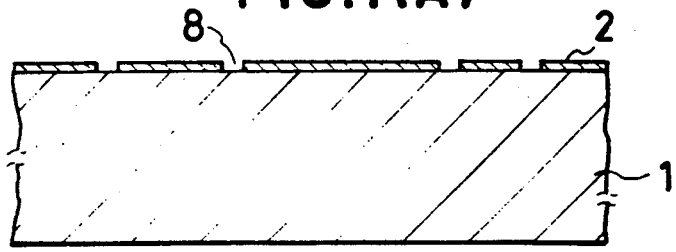
FIG. 1(A) to FIG. 1(D) are a diagram showing the steps of manufacturing a superconducting device of the present invention.

According to the present invention, a semiconductor device has an interconnecting wiring provided by means of a ceramic material which exhibits superconductivity at low temperatures (70° K. to 100° K., and preferably 77° K. or higher), wherein the interconnecting wiring is tightly connected at a contact section with the semiconductor device provided on its bottom side and made from a heat-resistant metal or its compound with a semiconductor material.

The semiconductor of the present invention is comprised of a semiconductor substrate which is desirably heat resistant at a higher temperature preferably between 600° C. and 900° C., for example, a single crystalline silicon semiconductor substrate and a plurality of elements provided within this semiconductor substrate such as an insulated gate field effect transistor (FET), bipolar transistor, static electricity induction transistor (SIT), resistance, and capacitor.

In the connecting section, a heat-resistant material, specifically tungsten (W), molybdenum (Mo), titanium (Ti), tantalum (Ta), chromium (Cr), or materials which are silicon compounds of these elements (for example, $TiSi_2$) are used. In addition, a non-oxide material, such as gold or platinum, or copper is tightly connected to the heat-resistant material. Then, a superconducting material with an electrical resistance of zero or close to zero can be formed in tight contact with the upper surface. This superconducting material is then selectively etched and patterned by photolithography techniques. Before or after this process, the crystal structure and oxygen vacancy volume are adjusted by long term heat annealing for 1 to 20 hours at 400° C. to 900° C., in an atmosphere of oxygen, argon-oxygen, or the like, so that the superconducting property can be provided at the temperature of liquid nitrogen.

By repeating this process once or several times, one layer or several layers of connecting wiring are formed of a material with zero electrical resistance.

When semiconductor elements of the above-mentioned type cooled to the temperature of liquid nitrogen, the mobility of the electrons or the holes can be increased 3 or 4 times. In addition, it becomes possible to reduce the electrical resistance of the lead wires and electrodes to zero. It is also possible to make the value of R (resistance) with respect to CR time constant indicating the time delay of the frequency characteristics.

In such a semiconductor device, when heat annealing is carried out in an oxidizing atomosphere, the oxygen in the superconducting material is blocked by the heat resistant metal, so that reaction is prevented with the silicon semiconductor on the bottom side resulting that no insulating film is formed. In addition, diffusion of the copper, gold, platinum throughout semiconductors is also blocked by the heat-resistant metal, and therefore it is possible to prevent recombination centers from being formed. Further, it is possible to provide gold, platinum or copper between the heat-resistant metal and the superconducting material to provide a desirable ohm contact for the superconducting material.

FIRST EXAMPLE

Now referring to FIG. 1(A), an insulating film 2 is formed on a silicon semiconductor substrate 1, and an opening 8 for connection is formed in the insulating film 2 by a photolithography technique.

In the semiconductor substrate 1 before the formation of insulating film 2, there are provided an insulated gate field effect transistor (IGFET), an active element such as a bipolar transistor or a resistance, and a passive element such as a capacitor. Provided on the lower side of the active element or passive element is an insulating film, which is made from a silicon oxide formed on the semiconductor and a silicon nitride, which is a heat-resistant non-oxide, formed on the silicon oxide in the present example. Then a contact section for an electrode is provided to correspond to the opening 8.

Figure 1B:
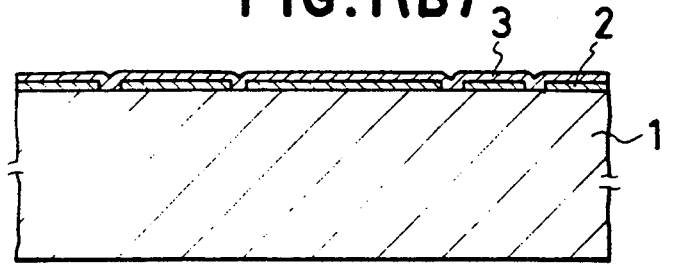

In FIG. 1(B), a layer of heat resistant metal and platinum, gold and copper are coated onto the upper surface of the substrate 1 with the insulating film 2 to a depth of 500 Å to 3000 Å by the sputtering method. In particular, in order to form the contact section only, the lift-off method is used, and in the regions other than the contact section, this layer is formed on the resist. Afterward, it is removed from all these regions. Thus it is possible to form the layer of heat resistant alloy and platinum, gold, or copper tightly attached to the semiconductor at the section 8 only. In addition, a material which exhibits superconducting capabilities is formed on the upper surface of the device in the form of a thin film. The thin film is formed by the sputtering method in this example. However, the screen printing method, vacuum evaporating method, or chemical vapor deposition method (CVD method) may also be used.

The sputtering device has a target of oxide compound of copper or an element in the Periodic Table IIa, IIIa, which can be generally represented as $(A_{1-x}B_x)Cu_yO_w$, where $x=0$ to 1, $y=2$ to 4, preferably 2.5 to 3.5, and $z=1.0$ to 4.0, preferably 1.5 to 3.5, and $w=4.0$ to 10.0, preferably 6.0 to 8.0. A is one element selected from the group of Ba, Sr and Ca, and B is a lanthanoid such as Y or Yb. One exaple is $(YBa_2)Cu_3O_{6-8}$, that is $x=0.67$, $y=3$, $z=3$, $W=6$ to 8.

Sputtering for this example is carried out at a substrate temperature of 450° C., in an argon-oxygen atmosphere, and at a frequency of 50 Hz and output of 100 W. The thin film of ceramic material in this case is 0.2 $\mu$m to 2 $\mu$m in thickness, for example, a thickness of 1 $\mu$m. Then, the semiconductor 1 of the present invention is tightly formed with the contacts 15, 15', which are formed of the heat resistant metal and copper, gold, or platinum.

The device is then annealed under oxygen at 400° C. for 1 to 30 hours, for example 10 hours. After that, it is possible to create a superconducting thin film of Tc onset=95° K. so as to make easy the crystal growth of the thin film, wherein the resistance starts to lower at 95° K. and becomes substantially zero at 79° K.

Even when this long heat treatment is carried out, the contact resistance of the contact section is $10^{-6}$ to $10^{-7}$ (ohm cm)$^{-1}$.

For this reason, by making the thickness of this region 0.2 $\mu$m or less, the resistance during the ohm contact is $10^{-4}$ ohms or less.

Figure 1C:
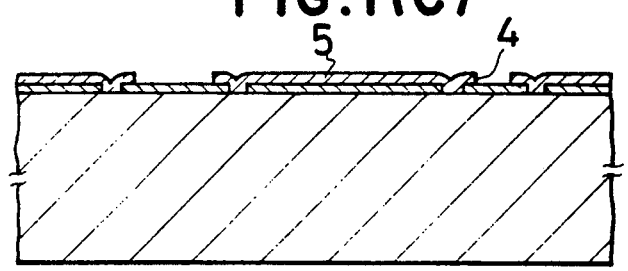

After this, the prescribed patterning is carried out on the thin film using photolithography techniques. In this way, the electrodes and leads for the interconnecting wiring containing the connections for the electrode of the elements and the input and output terminals are photoresist coated for the final configuration. Selective removal or etching is performed with acid, for example, sulphuric or nitric acid to obtain the semiconductor device of FIG. 1(C).

In this patterning, the plasma etching process may be employed, using fluoride or silicide gases. In such a case, for example, the RIE (Reactive Ion Etcing) method is used in a $CCl_4+O_2$ atmosphere.

This patterning can be carried out after the formation of the superconducting film, followed by heat annealing, so that only the patterned connecting operating section can be selectivey crystallized. In this case, because the crystal sizes are small in the initial status, a smaller pattern is possible in the interconnecting wiring.

Figure 1D:
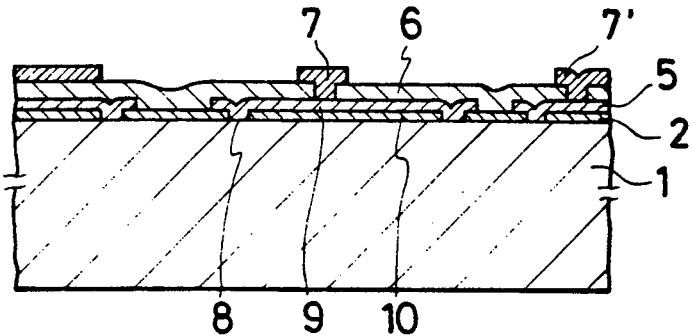

FIG. 1(D) shows the multilayer wiring which is carried out as required. In particular, to connect the semiconductor device and the outside lead, the oxide superconducting material 7, 7' are used for the wiring to the second layer. At this time, the contact with the wiring 9 of the first oxide superconducting material is the same oxide so that mutual direct contact is acceptable without a heat resistant metal between them. An interlayer insulator 6 is formed, providing contacts 16,16' with the silicon oxide, oxide superconducting material 7,7'.

Specifically, in the present invention, at least one layer of the interconnecting wiring of the elements are formed from the superconducting material. In addition, the electrode which is drawn outside is provided with a metal pad for better bonding property. The pad is comprised of a heat-resistant metal and gold, plutinum or copper formed for the contact section. Of course, the pad section can be made of a superconducting material when the better tight bonding with the electrode is available.

SECOND EXAMPLE

Figure 2:
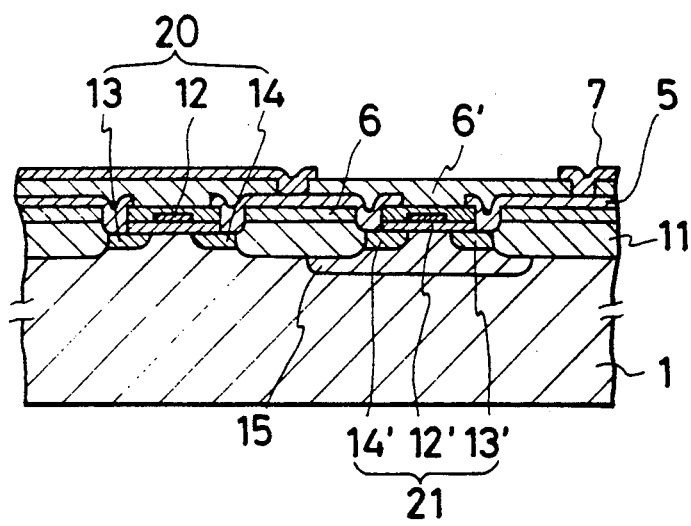
FIG. 2 is a diagram showing another superconducting device of the present invention.

FIG. 2 is an enlarged view of another embodiment of the present invention, specifically, a C/MOS (complementary IGFET) section only.

The section has a silicon semiconductor substrate 1 with adequate durability from annealing. Further, a P-type well 15 is buried within the substrate, and silicon oxide 11 is provided. One IGFET 20 is provided with a gate electrode 12, a source 13, and a drain 14 as a P-channel IGFET. Another IGFET 21 is provided with a gate electrode 12', a source 13', and a drain 14', as an N-channel IGFET. The gate electrodes 12, 12' are made of an oxide superconducting material, and the wiring interconnections between the gate electrodes 12, 12' and the other wirings 5, 7 are formed of the superconducting material as in the First Example.

THIRD EXAMPLE

Figure 3A:
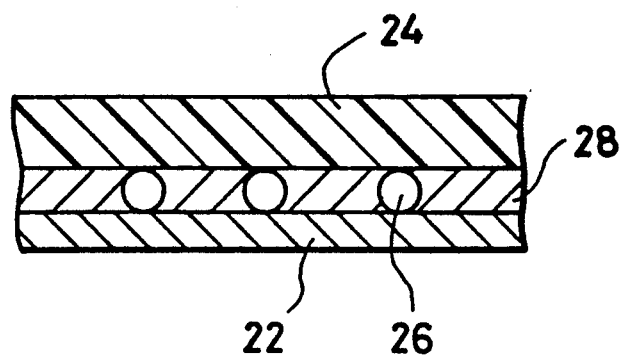
FIG. 3(A) is a cross sectional view illustrating an application of the present invention to a liquid crystal device.

FIG. 3(A) illustrates an application of the present invention to a liquid crystal device. A superconducting oxide film 22 is bonded to a glass plate 24 of the liquid crystal device through a gold bump contact 26, and an organic resin 28 is filled between the superconducting oxide film 22 and the glass plate 24.

FOURTH EXAMPLE

Figure 3B:
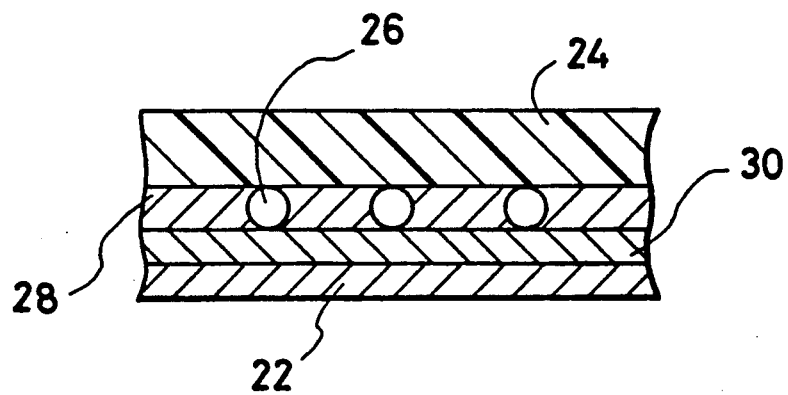
FIG. 3(B) is a cross sectional view illustrating another application of the present invention to a liquid crystal device.

FIG. 3(B) illustrates another application of the present invention to a liquid crystal device. A superconducting oxide film 22 is bonded to a glass plate 24 of the liquid crystal device through a gold bump contact 26 and a heat resistant film 30, and an organic resin 28 is filled between the heat resistant film 30 and the glass plate 24.

By means of the present invention, forming semiconductor devices during cooling at a low temperature rather than at room temperature can be put to practical use for the first time in the world.

The frequency characteristics especially can be improved by cooling semiconductors down to the liquid nitrogen temperature. In metal conductors, on the other hand, the resistance, conversely, is increased at a low temperature. This drawback is eliminated by using a superconducting material. In addition, to use this type of superconducting material effectively, a multilayered structure of a heat resistant metal or its semiconductor material, and platinum gold or copper is formed on the upper surface of the semiconductor, wherein the heat resistant metal or its semiconductor material is tightly connected to the semiconductor at the connecting section, and the platinum, gold or copper is formed on the heat resistant metal or its semiconductor material, on which an oxide superconducting material is formed.

In addition, contact resistance for the connecting section is effectively lowered by making it three to five layers rather than two layers.

The development of the technical concept of the present invention has made it possible to apply a 16M to 1 G bit ULSI and the like in practice.

In the present invention, the semiconductor need not be silicon, but may be a compound semiconductor such as GaAs. In addition, a III–V compound semiconductor of GaAs and the like may be obtained by heteroepitaxial growth on a silicon semiconductor for use as a semiconductor film, whereby ultra high speed action can be induced. In this case, however, it is necessary to take steps to lower the annealing temperature so that the semiconductor substrate does not deteriorate during annealing.

In the present invention, the superconducting material is copper oxide superconducting material. However, other superconducting materials on which a detailed pattern is possible can be effectively used.

In the present invention, a semiconductor material with an active element is provided as the substrate, and an oxide superconducting material is tightly connected to the insulating material on the upper surface of the semiconductor material, so that the contact section is improved in ohm contact capability.

A ceramic material with a similar coefficient of thermal expansion such as YSZ (yttrium stabilized zircon) may be used as the substrate, so that the superconducting material is formed as a thin film on its upper surface. The contact section is selectively made from platinum or copper. In addition, a heat resistant metal or semiconductor material is formed in close contact with the contact section. Subsequently, the semiconductor chip may be connected at its connecting portion to the contact section by the face down method.

However, when this type of material is used, the active element must be provided separately. This has the drawback that it is difficult to accomplish the ultra high integrated circuitry.

What is claimed is:

1. An electronic device comprising:
   a substrate comprising a silicon containing material;
   at least one device component formed on or in said substrate; and
   a lead formed on or in said substrate, which comprises an oxide superconducting material and electrically contacts with said device component, wherein a buffer layer comprising a refractory material is interposed between said lead and said device component.

2. The electronic device of claim 1 wherein said refractory material is selected from the group consisting of tungsten (W), molybdenum (Mo), titanium (Ti), tantalum (Ta), chromium (Cr), and a silicon compound thereof.

3. The electronic device of claim 1 wherein said device component is an insulated gate FET.

4. The electronic device of claim 1 wherein said device component is a bipolar FET.

5. The electronic device of claim 1 wherein said device component is a SIT.

6. The electronic device of claim 1 wherein said oxide superconducting material comprises copper and oxygen.

7. An electronic device comprising:
   a substrate comprising a semiconductor material;
   at least one device component formed on or in said substrate; and
   a lead formed on or in said substrate, which comprises an oxide superconducting material and electrically contacts with said device component, wherein first and second buffer layers are interposed between said lead and device component, wherein said first layer is in an ohmic contact with said lead and said second layer blocks materials diffusing from said lead or first layer to said device component and wherein said second layer comprises a refractory material selected from the group consisting of silicon compound of tungsten (W), molybdenum (Mo), titanium (Ti), tantalum (Ta), and chromium (Cr).

8. The electronic device of claim 7 wherein said device component is an insulated gate FET.

9. The electronic device of claim 7 wherein said device component is a bipolar FET.

10. The electronic device of claim 7 wherein said device component is a SIT.

11. The electronic device of claim 7 wherein said oxide superconducting material comprises copper and oxygen.

12. A superconducting device comprising a substrate consisting of a material and having an electric connecting section and a copper oxide superconducting material thereon, and an electric interconnecting means for the electric connecting section and the superconducting material, the electric interconnecting means formed in a multilayer structure of one first member selected from the group of copper, gold, platinum and materials including copper, gold and platinum as a main component, the first member directly attached to the superconducting material, one second member made of a heat resistant material selected from the group of compounds of tungsten (W), molybdenum (Mo), titanium (Ti), tantalum (Ta), and chromium (Cr) with the substrate material and the second member directly attached to the first member and the substrate.

13. The superconducting device of claim 12, wherein the oxide superconducting material is made from one member selected from the group of copper compounds which include elements in Groups IIa and IIIa of the Periodic Table.

14. A superconducting device comprising a semiconductor substrate having a plurality of semiconductor elements with an electrode section provided thereon and input and output terminals for an external electric signal and the electrode section of the semiconductor elements, and electric connecting means between the electrode and the input and output terminals made of the semiconductor elements, and electric connecting means between the electrode and the input and output terminals made of an oxide superconducting material, wherein the electrode section is comprised of one member selected from the group of compounds of tungsten (W), molybdenum (Mo), titanium (Ti), tantalum (Ta), and chromium (Cr) with the substrate material and directly connected to the semiconductor, and a material selected from one group of copper, gold, platinum, and materials including copper, gold, platinum as a main component and directly connected to the one member, and the oxide superconducting material directly attached to the material.

15. A superconducting device as in claim 12, where said substrate material comprises silicon.

16. A superconducting device as in claim 14, where said substrate material comprises silicon.

17. An electronic device comprising:
a semiconductor substrate having a semiconductor device associated therewith; and
an oxide superconducting lead formed with respect to said substrate, said lead connected to a semiconductor material of said semiconductor device through a buffer layer.
wherein said buffer layer includes a first layer in contact with said superconducting lead, said first layer comprising a material which is capable of making an ohmic contact with said superconducting lead without being oxidized by said oxide superconducting lead, and a second layer in contact with said semiconductor material, said second layer comprising a metal compound which is capable of preventing the material of said first layer from diffusing into said semiconductor material.

18. A superconducting device comprising a substrate consisting of a material and having an electric connecting section and a copper oxide superconducting material thereon, and an electric interconnecting means for the electric connecting section and the superconducting material, the electric interconnecting means formed by one member made of a heat resistant material selected from the group of tungsten (W), molybdenum (Mo), titanium (Ti), tantalum (Ta), chromium (Cr), and compounds thereof with the substrate material and the electric interconnecting means directly attached to the superconducting material and the substrate.

* * * * *